United States Patent [19]

Okamoto et al.

[11] Patent Number: 4,872,050
[45] Date of Patent: Oct. 3, 1989

[54] INTERCONNECTION STRUCTURE IN SEMICONDUCTOR DEVICE AND MANUFACTURING METHOD OF THE SAME

[75] Inventors: Tatsuo Okamoto; Hideo Kotani; Takio Oono; Kiyoto Watabe; Yasushi Kinoshita; Yoshikazu Nishikawa, all of Itami, Japan

[73] Assignee: Mitsubishi Denki Kabushiki Kaisha, Tokyo, Japan

[21] Appl. No.: 168,386

[22] Filed: Mar. 15, 1988

[51] Int. Cl.$^4$ .................. H01L 29/52; H01L 23/48; H01L 29/44; H01L 29/62
[52] U.S. Cl. .......................................... 357/71; 357/68
[58] Field of Search .................... 357/71, 68

[56] References Cited

U.S. PATENT DOCUMENTS

| | | | |
|---|---|---|---|
| 4,239,346 | 12/1980 | Lloyd | 357/71 |
| 4,265,935 | 5/1981 | Hall | 357/71 |
| 4,413,272 | 11/1983 | Mochizuki et al. | 357/71 |
| 4,641,170 | 2/1987 | Ogura et al. | 357/68 |
| 4,712,125 | 12/1987 | Bhatia et al. | 357/68 |
| 4,731,341 | 3/1988 | Kawakatsu | 357/71 |

OTHER PUBLICATIONS

"A VLSI Biopolar Metallization Design . . . ", IBM J. Res. Develop., vol. 26, No. 3, May 1982, pp. 362-371.
"VLSI Multilevel Metallization", Solid State Technology, Dec. 1984, pp. 93-100.

Primary Examiner—Eugene R. LaRoche
Assistant Examiner—Michael Shingleton
Attorney, Agent, or Firm—Oblon, Spivak, McClelland, Maier & Neustadt

[57] ABSTRACT

Conductive layers (5a, 9a) included in a multi-layer structure (30a) are electrically interconnected through a conductive connection wall (13a) provided in a contact hole (12) and contacting the side surface (22) of the multi-layer structure (30a). The upper conductive layer (11a) existing on the multi-layer structure (30a) and the lower conductive layer (3) exisitng under the multi-layer structure (30a) are electrically interconnected through a conductive film (11b) provided in the contact hole (12). These two interconnections are insulated from each other by an insulating film (18) provided on the connection wall (13a).

8 Claims, 9 Drawing Sheets

INTERCONNECTION STRUCTURE IN SEMICONDUCTOR DEVICE AND MANUFACTURING METHOD OF THE SAME

BACKGROUND OF THE INVENTION

1. Field of the Invention

The present invention relates to a semiconductor device and a manufacturing method of the same, and more particularly, it relates to an improvement of an interconnection structure in the semiconductor device.

2. Description of the Prior Art

A semiconductor device having a multi-layer structure of conductive layers in which some conductive layers are connected to each other is well-known in the art its characters of a high data processing speed and a high degree of integration. A conventional multi-layer structure of conductive layers is disclosed in "A VLSI Bipolar Metallization with Three-Level Wiring and Area Array Solder Connections", IBM J. RES DEVELOP. VOL. 26 No. 3, pp 362–371, May 1982, for example.

A part of a conventional semiconductor device having such a multi-layer structure of conductive layers is shown in FIG. 1A and FIG. 1B, where FIG. 1A is a plane view and FIG. 1B is a sectional view taken along a line X-Y in FIG. 1A. On one major surface of a semiconductor substrate 101, an insulating layer 102, an conductive layer 103 and an insulating layer 104 are serially provided. A conductive layer 105 is selectively formed on the upper surface of the insulating layer 104, and an insulating layer 106 having a window covers the exposed surfaces of the insulating layer 104 and the conductive layer 105. The window is served as a contact hole 107 through which a conductive layer 108, which is selectively given on the insulating layer 106, contacts with the conductive layer 105. On the exposed surfaces of the insulating layer 106 and the conductive layer 108, an insulating layer 109 is formed. Respective one of the conductive layers 103, 105 and 108 may be formed as a double-layer such as a policide film or a multi-layer having more than two layers. A contact hole 107 is shaped through the insulating layer 106 at a position between the conductive layers 105 and 108, through which the conductive layers 105 and 108 are electrically connected to each other. Another contact hole 110 is shaped through the insulating layers 104, 106 and 109, and a conductive layer 111 is formed on the insulating layer 109 to contact with the conductive layer 103 through the contact hole 110.

The conductive layers 103, 105, 108 and 111 are connected to internal circuits (not shown) provided in the semiconductor device, respectively. The internal circuits are connected to each other by the interconnection structure shown in FIG. 1A and FIG. 1B, according to the connection rule previously decided. For example, the respective internal circuits connected to the conductive layers 108 and 105 are electrically connected through the contact hole 107, while those connected to the conductive layers 111 and 103 are connected through the contact hole 110.

Although the conventional interconnection structure is suitable for a single interconnection, it has a disadvantage that a plurality of contact holes must be provided in the case that two or more interconnections are required. For example, two contact holes 107 and 110 must be formed for obtaining two interconnections, one of which is the interconnection between the conductive layers 105 and 108, and the other is between the conductive layers 103 and 111. Namely, the number of contact holes increases in proportial to the number of interconnections, and increased number of the contact holes brings a complex process on the manufacture of the semiconductor device. As a result, it is difficult to improve the yield of the semiconductor device.

Further, since the contact holes must be formed respectively at different positions above the substrate a rate of the occupation area of contact holes to the whole surface area of the substrate is relatively large, thereby a layout of elements on the substrate is complicated.

Moreover, when an interconnection between the lowest conductive layer 103 and a conductive layer (not shown) provided on the insulating layer 109 is required, a multi-layer structure consisting of the insulating layers 104, 106 and 109 through which the contact hole is shaped must be formed on the substrate.

SUMMARY OF THE INVENTION

According to the present invention, a semiconductor device comprises: (a) a substrate; (b) a first conductive layer provided on an upper surface of said substrate and connected to an internal circuit formed in an arbitrary region on said substrate; (c) a first insulating layer formed on an upper surface of said first conductive layer and having a window; (d) a multi-layer structure provided on an upper surface of said first insulating layer and having; (d-1) second conductive layers provided in parallel direction to said upper surface of said substrate and connected respectively to internal circuits formed in an arbitrary region on said substrate; (d-2) a second insulating layer inserted between said second conductive layers for insulating said second conductive layers from each other; and (d-3) a third insulating layer provided in a top of said multi-layer structure; where said multi-layer structure being provided with a contact hole communicating to said window, and a side surface of said contact hole is defined by a side surface of said multi-layer structure; (e) a third conductive layer provided on an upper surface of said multi-layer structure and connected to an internal circuit formed in an arbitrary region on said substrate; (f) a side wall provided in said contact hole to cover said side surface of said multi-layer structure and having an insulating film provided at least on a surface region of said side wall which faces to a center of said contact hole; and, (g) a connection film provided in said contact hole contacting said first conductive layer through said window and connected to said third conductive layer on said contact hole thereby to electrically interconnect said first and third conductive layers, said connection film being electrically insulated from said second conductive layers by said side wall.

The present invention is also directed to a method for manufacturing an interconnection structure interconnecting conductive layers provided on a semiconductor substrate. According to the present invention, the method comprising the process steps of: (a) providing a first conductive layer on an upper surface of a substrate, wherein said first conductive layer is connected to an internal circuit formed in arbitrary region on said substrate; (b) forming an first insulating layer on an upper surface of said first conductive layer; (c) providing a multi-layer structure on an upper surface of said first insulating layer, said multi-layer structure having; second conductive layers provided in parallel to said upper surface of said substrate and connected respectively to internal circuits formed in an arbitrary region on said substrate, a second insulating layer inserted between said second conductive layers for insulating said second conductive layers from each other, and a third insulating layer provided in a top of said multi-layer structure; (d) selectively removing said multi-layer structure to form a recess in said multi-layer structure, said recess reaching said upper surface of said first insulating layer; (e) forming a side wall covering a side surface of said multi-layer structure which defines a side surface of said recess, where said side wall includes an insulating film existing at least in a surface region of said side wall which faces a center of said recess, and said side wall also contacts an outer part of a bottom surface of said recess which is a part of said upper surface of said first insulating layer; (f) selectively removing a part of said first insulating layer existing under said recess to expose a contact region being a part of said first conductive layer; and (g) forming a third conductive layer in said recess and on an upper surface of said third insulating layer, thereby to interconnect said first conductive layer and an internal circuit provided in an arbitrary region on said substrate which is connected to said third conductive layer at a place out of said recess.

Accordingly, an object of the present invention is to provide a semiconductor device and a method for manufacturing the same capable of decreasing the number of contact holes given in the semiconductor device.

Another object of the present invention is to simplify a process for manufacturing an interconnection structure in a semiconductor device.

Further object of the present invention is to improve the yield of the product of semiconductor devices.

These and other objects, features, aspects and advantages of the present invention will become more apparent form the followingy detailed description of the present invention when taken in conjunction with the accompanying drawings.

DESCRIPTION OF THE PREFERRED EMBODIMENTS

Figure 1A:
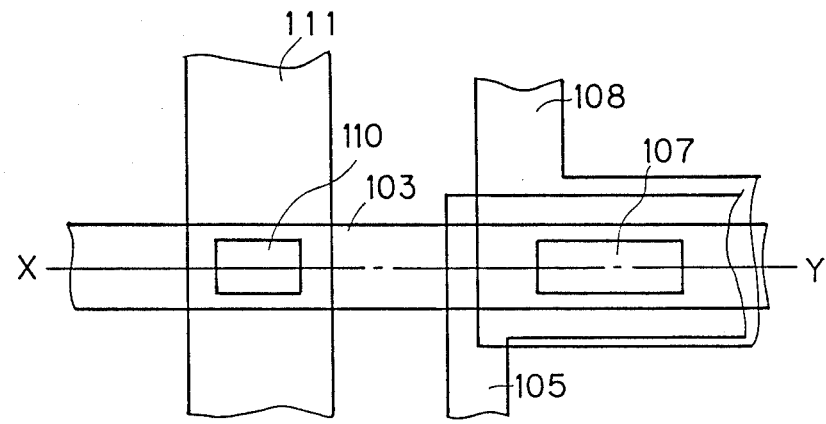
FIG. 1A is a partial plane view of a conventional semiconductor device indicating a conventional interconnection structure.
Figure 1B:
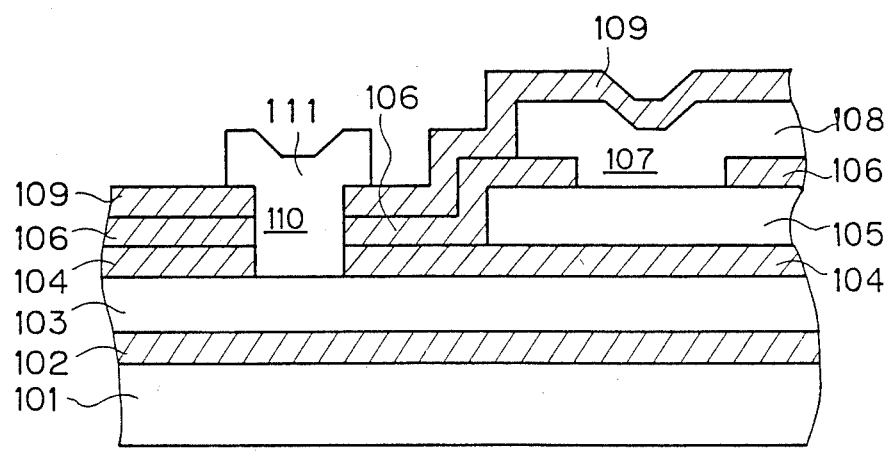
FIG. 1B is a cross section taken along a line X-Y in FIG. 1A, FIG. 2A to FIG. 2G are cross sections of a semiconductor device to illustrate the sequence of process steps for the manufacture of a semiconductor device having an interconnection structure in accordance with a preferred embodiment of the present invention.

Referring to FIG. 2A through FIG. 2G, manufacturing process steps of a semiconductor device having an interconnection structure according to a preferred embodiment of the present invention are illustrated as cross sections of the semiconductor device. In a first process step, shown in FIG. 2A, a semiconductor substrate 1 made from silicon is prepared and an insulating layer 2 made from silicon oxide ($SiO_2$) is provided on one major surface of the semiconductor substrate 1.

On an upper surface of the insulating layer 2, an electric conductive layer 3 is formed by employing a chemical vapor deposition (CVD) method, a sputtering method or the like. The conductive layer 3 is connected to an internal circuit (not shown) provided in an arbitrary region on the substrate 1. When an insulator substrate is prepared in place of the semiconductor substrate 1, the insulating layer 2 is not provided so that the conductive layer 3 is formed on the insulator substrate directly.

A insulating layer 4 is formed on an upper surface of the conductive layer 3 by employing a thermal oxidation method, a CVD method, a sputtering method or a vacuum vapor deposition method. On an upper surface of the insulating layer 4, a multi-layer structure 30 having a conductive layer 5, an insulating layer 6, a conductive layer 8 and an insulating layer 9 is formed by laminating the layers 5, 6, 8 and 9 serially in this order. The conductive layers 5 and 8 are respectively connected to internal circuits (not shown) formed in an arbitrary region on the substrate 1. The conductive layers 5 and 8 are electrically insulated from each other by the insulating layer 6. The conductive layers 3, 5 and 8 are formed in parallel direction to the upper surface of the substrate 1 and may be formed as films selected from the groups of:

(a) silicon films such as single crystal silicon films, polysilicon films, amorphous silicon films or the like, (b) simple metal films such as W, Mo, Cu, Al or the like, (c) aluminum alloy films such as AlSi, AlSiCu or the like, and (d) metal silicide films such as $MoSi_2$, $WSi_2$, $TiSi_2$, $TaSi_2$, $CoSi_2$ or the like.

When the silicon films are employed, impurities such as P, As and B are doped in the silicon films by an ion implantation method, a thermal diffusion method or the like, in order to lower the electric resistance of the silicon films. The electric conductive layers 3, 5 and 8 may be deposited by a CVD method, a sputtering method or the like.

On the other hand, the electric insulating layers 2, 4, 6 and 9 are made of materials such as silicon nitride, silicon oxide or the like. When a conductive layer existing just under an insulating layer is formed as a silicon film, the insulating layer can be formed by a thermal nitridation method, a thermal oxidation method or the like, whether the silicon film is a single crystal silicon, polysilicon or amorphous silicon. When the conductive layer is a silicide film, the insulating layer of silicon oxide can be formed on the conductive layer by a thermal oxidation of the surface region of the silicide film. In the latter case, the silicide film before the thermal oxidation process should have excess silicon exceeding one required from the stoichiometry of the silicide composition, in order to prevent a formation of a metal oxide film in place of the silicon oxide film. Since the stoichiometric composition of molybdenum silicide is $MoSi_2$, the composition of the molybdenum silicide film before oxidation should be $MoSi_{2.5}$, for example. If the conductive film of $MoSi_2$ is thermally oxidized, the insulating film formed by the oxidation has poor insulativity, since volatile molybdenum oxide is produced. The insulating layers 2, 4, 6 and 9 consisting of silicon nitride or silicon oxide may be formed by a CVD method, a sputtering method or a vacuum vapor deposition method, regardless of the material forming the substrate 1 and the conductive layers 3, 5 and 7 existing on the insulating layers 2, 4, 6 and 9, respectively. Especially, the silicon oxide film may be also formed by sintering a liquid glass such as spin-on glass (SOG) applied on the upper surface of the layer existing under the silicon oxide film. Each of the thickness of the conductive layer 3, 5 and 8 and the insulating layer 2, 4, 6 and 9 is several hundred Å to several $\mu$m.

Figure 2A:
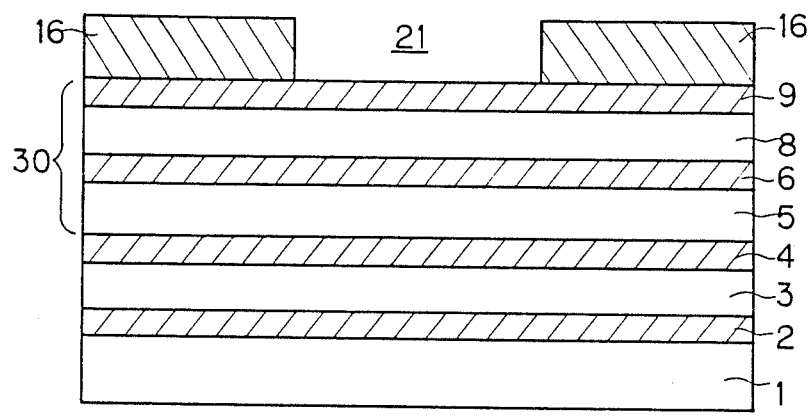

Referring to FIG. 2A, a resist material is applied on an upper surface of the insulating layer 9. By removing a part of the resist material by a photolithography, a resist mask 16 having a window 21 is formed. The insulating layer 9, the conductive layer 8, the insulating layer 6 and the conductive layer 5 are selectively and serially etched by using the resist mask 16 to shape a contact hole (recess) 12 shown in FIG. 2B. As a result, the multi-layer structure 30 becomes a multi-layer structure 30a having side surfaces 22, and the layers 9, 8, 6 and 5 become layers 9a, 8a, 6a and 5a, respectively, each of which has side surfaces defining the boundary between the contact hole 12 and the corresponding layer. A bottom surface 23 of the contact hole 12 is corresponding to a part of a part of the upper surface of the insulating layer 4.

For example, when the insulating layers 9 and 6 are made of silicon oxide and the conductive layers 5 and 8 are made of polysilicon, the insulating 9 and 6 are etched by a plasma etching using ($CHF_3+O_2$) gas and the conductive layers 5 and 8 are etched by a plasma etching using ($CCl_4+O_2$) gas. A parallel plane type plasma etching apparatus may be employed for the etching processes, and in this case, the layers 9, 8, 6 and 5 are anisotropically etched, where the etching rate in the vertical direction is larger than that in the lateral direction, to provide the contact hole 12 having a width corresponding to a width $W_1$ of the window 21. The terminal time point of the silicon oxide film etching can be found by detecting a product of CO gas, and the terminal time point of the polysilicon film etching can be found by monitoring a change in the plasma light emitting intensity of $SiCl_2$ gas.

Figure 2B:
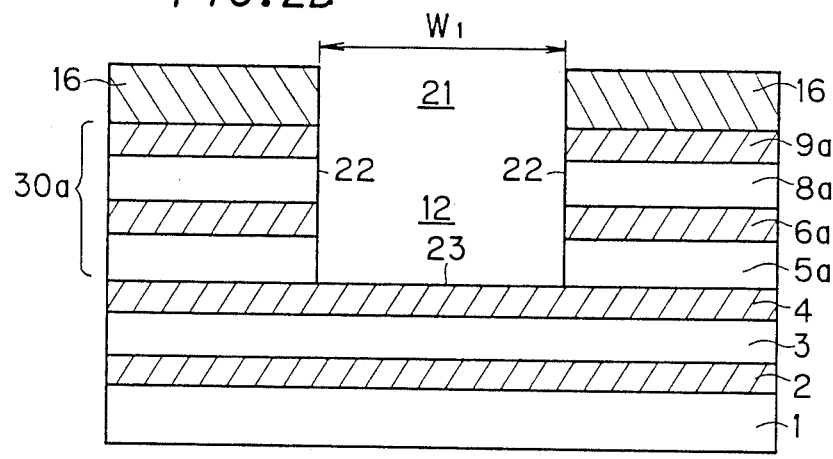
Figure 2C:
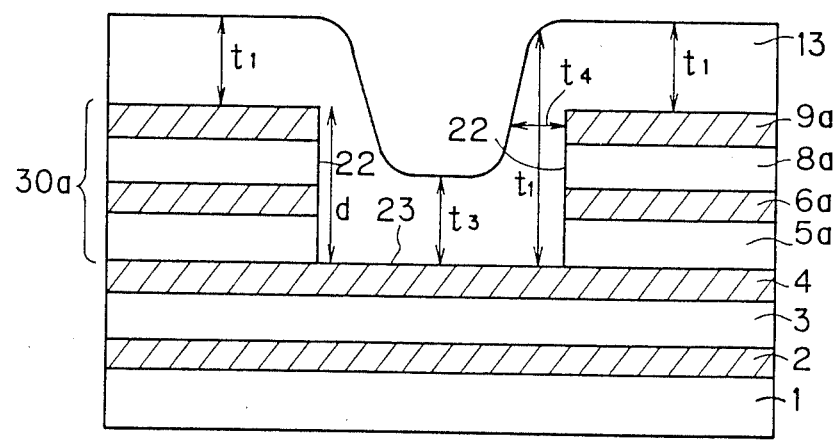
Figure 2D:
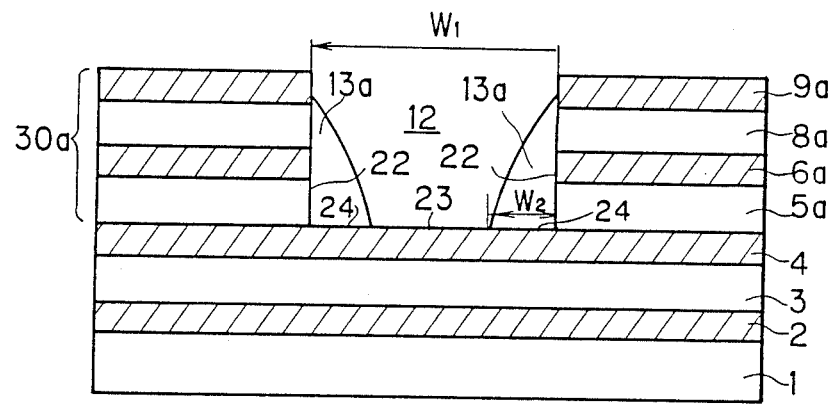

After obtaining the structure of FIG. 2B, the resist mask 16 is removed, and a conductive material layer 13 covering the side surfaces 22 of the multi-layer structure 30a, the upper surface of the insulating layer 9a and the bottom surface 23 of the contact hole 12 is provided by a CVD method or a sputtering method (FIG. 2C). The conductive material layer 13 is anisotropically etched to form a conductive connection wall 13a for electrically connecting the conductive layers 8a and 5a in the vertical direction. As shown in FIG. 2D, the connection wall 13a contacts only with the side surface 22 of the multi-layer structure 30a and a spacer region 24 which is a part of the insulating layer 4a under the outer side area of the bottom surface 23 of the contact hole 12. Since the connection wall 13a is formed by the anisotropic plasma etching, the vertical cross section shape of the connection wall 13a is substantially a triangle having an arc side.

For obtaining the preferred connection wall 13a, the shape of the conductive material layer 13 (FIG. 2C) is determined as follows: In order to find a quantitative expression, the thickness distribution of the conductive layer 13 is expressed by (a) a thickness $t_1$ of the layer 13 on the insulating layer 9a, (b) a representative thickness $t_2$ of the layer 13 on the outer side region of the bottom surface 23, (c) a thickness $t_3$ of the layer 13 on the central region of the bottom surface 23, and (d) a thickness $t_4$ of the layer 13 in the lateral direction measured from the side edge of the insulating layer 9a.

The representative thickness $t_2$ may be defined as a thickness of the layer 13 measured along an imaginary line perpendicular to the bottom surface 23 and passing a central point of the bi-directional arrow line indicated for expressing the thickness $t_4$. For obtaining the connection wall 13a shown in FIG. 2D, the thickness $t_1$, $t_2$ and $t_3$ should satisfy the relation:

$$t_2 >> t_1, t_3 \qquad (1)$$

since only the part of the layer 13 close to the side surface 22 should remain after the selective etching of the layer 13.

In the plasma etching for obtaining the connection wall 13a, ions are generated by an electric discharge between parallel plate electrodes positioned in parallel to the major surface of the semiconductor substrate 1. The ions are accelarated by the electric field perpendicular to the major surface of the semiconductor substrate 1 to reach the semiconductor device currently manufactured. Therefore, the vertical etching of the conductive layer 13 is performed in a rate larger than a lateral etching rate. When the conductive layer 13 is formed so as to satisfy the relation (1), the portions of the conductive layer 13 having the thickness $t_1$ and $t_3$ respectively are completely removed by the etching, while the remaining portion of the conductive layer 13 having the thickness $t_2$ is not completely removed to give the connection wall 13a, since the thickness $t_2$ is considerably larger than the thicknesses $t_1$ and $t_3$.

For example, consider the case where the width $W_1$ (diameter) of the contact hole 12 is 1.5 $\mu$m, the thickness d of the multi-layer structure 30a is 1 $\mu$m, and the thickness $t_1$, $t_4$ and $t_3$ are about 0.8 $\mu$m, 0.3 to 0.5 $\mu$m and 0.8 $\mu$m, respectively. In this case, a width $W_2$ of the connection wall 13a at the bottom surface 23 of the contact hole 12, which is the length of the spacer area 24, becomes 0.3 to 0.5 $\mu$m.

When the conductive layer 13 is made of polysilicon, impurities such as phosphorus are doped in the layer 13 by a thermal diffusion, in order to lower the electric resistance of the layer 13. The anisotropic plasma etching for selectively removing the layer 13 may be performed by employing the etching apparatus of parallel plates type and a etching gas including $C_2Cl_2F_4$, for example, where the pressure of the etching gas is $10^{-1}$ Torr or lower. The width (thickness) $W_2$ and the hight of the connection wall 13a can be controlled by properly selecting the etching time.

Figure 2E:
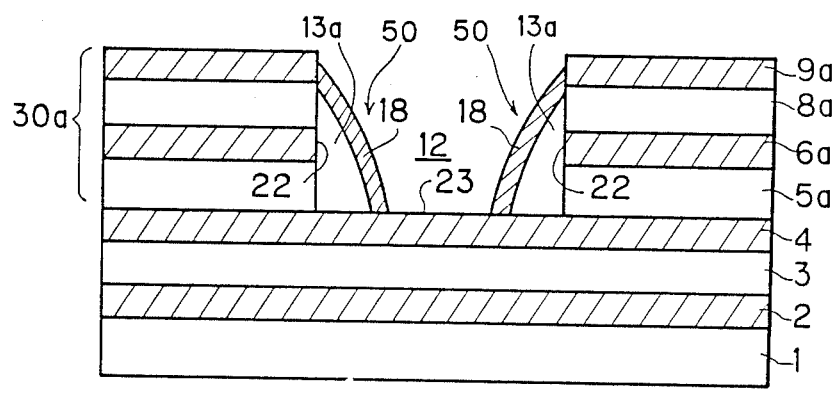

Referring to FIG. 2E, an insulating film 18 covering the exposed surface of the connection wall 13a is formed by oxiding the surface region of the connection wall 13a. When the connection wall 13a is made of polysilicon, the device under the manufacturing process is heated at 800° to 1000° C. in an $O_2$ or $H_2O$ atmosphere, to form the insulating film 18. For example, when the conductive layers 3 and 8a and the connection wall 13a are made of polysilicon having phosphorus of $10^{21}$ cm$^{-3}$ as impurities, and the thicknesses of the insulating layers 4 and 9a made of silicon oxide are about 4000 Å, the thermal oxidation is performed about one hour at the temperature 850° C. in an $H_2O$ atmosphere, thereby to obtain the insulating film 18 of silicon oxide having about 2000 Å in thickness. The increase of the respective thickness of the insulating layers 4 and 9a due to the thermal oxidation is only about 500 Å. On the other hand, when the insulating layers 4 and 9a are made of silicon nitride, a depression effect against a diffusion of oxidation species in the insulating layers 4 and 9a is superior to that in the silicon oxide, and hence, the conductive layers 3 and 8a are not substantially oxidized.

From the process, a side wall 50 covering the side surface 22 of the multi-layer structure 30a and having the connection wall 13a and the insulating film 18 is obtained in the contact hole 12. The side wall 50 has a vertical cross section of substantial triangle form having an arc oblique side which defines a surface of the side wall 50 facing the center of the contact hole 12, since the insulating film 18 is provided on the surface region of the side wall 50 facing the center of the contact hole 12. The bottom side of the triangle exists on the upper surface of the spacer region 24.

Figure 2F:
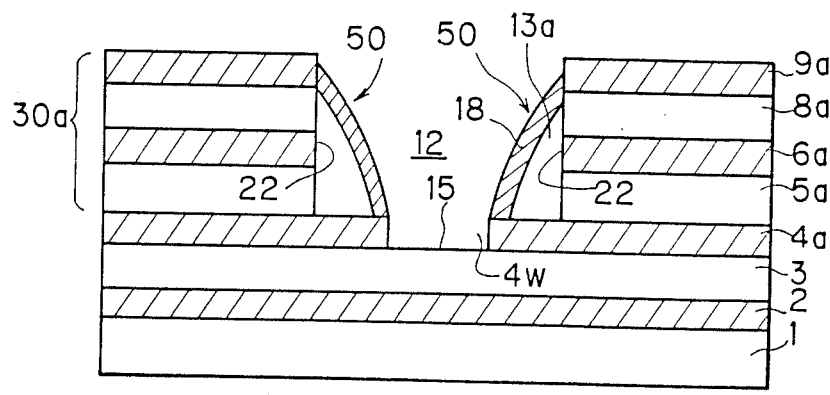

In the next process step shown in FIG. 2F, the exposed part of the insulating layer 4 defining the central region of the bottom surface 23 of the contact hole 12 is removed to form a window 4w so that a contact region 15 which is a part of the upper surface of the conductive layer 3 is exposed to the contact hole 12. Since the side wall 50 is present on the outer area of the bottom surface 23 of the contact hole 12, the width of the window 4w is smaller than the width of the contact hole 12. The spacer region 24 surrounding the window 4w is not removed and functions as a spacer between the side wall 50 and the conductive layer 3. The contact hole 12 and the window 4w are communicated to each other in the central region of the bottom of the contact hole 12. When the insulating layers 4a and 9a and the insulating film 18 are made of the same material, silicon oxide, for example, the insulating layer 4a is so formed that the thickness of the insulating layer 4a is smaller than those of the insulating layer 9a and the insulating film 18. When the insulating layers 4 and 9a and the insulating film 18 are subjected to the anisotropic etching, only the exposed portion of the insulating layer 4 is completely etched to expose the contact region 15 of the conductive layer 3 without exposing the conductive layer 8a and the connection wall 13a. On the other hand, provided that the insulating layer 4a is made of silicon nitride, and the insulating layer 9a and the insulating film 18 are made of silicon oxide, a plasma etching using a $CF_4$ gas may be employed to selectively etch the insulating layer 4 only.

Figure 2G:
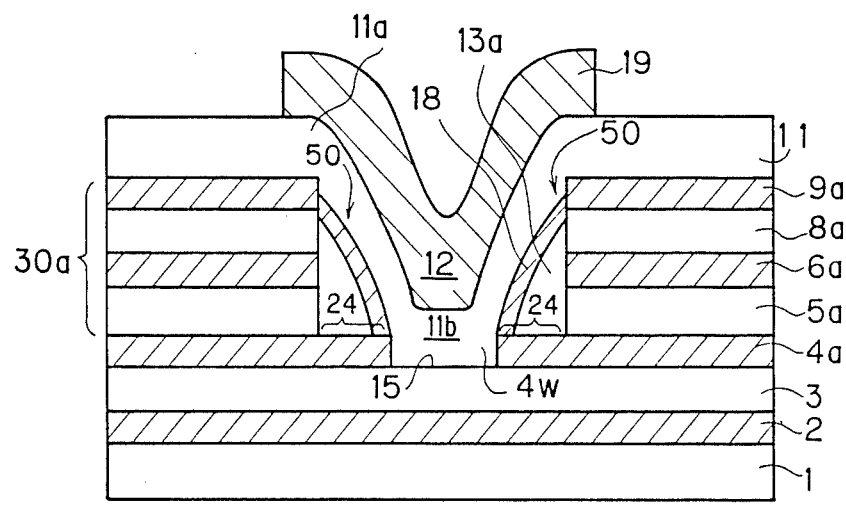

Referring to FIG. 2G. a conductive layer 11 is formed by a sputtering, a CVD method or the like, so as to cover the insulating layer 9a, the insulating film 18 and the contact region 15. The conductive layer 11 may be made of polysilicon having phosphorus, silicide, a simple metal such as Al, Mo and W, an alloy such as Al-alloy, or the like. On a part of the conductive layer 11 existing above the contact hole 12, a resist mask 19 is formed by an application of a resist material and a photolithography of the same. Using the resist mask 19, a part of the conductive layer 11 existing on the insulating layer 9a is selectively removed.

Figure 3A:
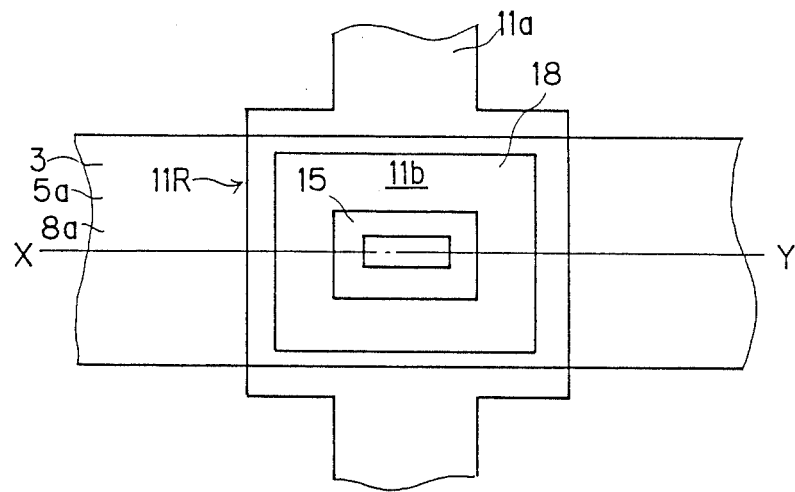
FIG. 3A and FIG. 3B are a plane view and a cross section of the interconnection structure obtained by the preferred embodiment, respectively.
Figure 3B:
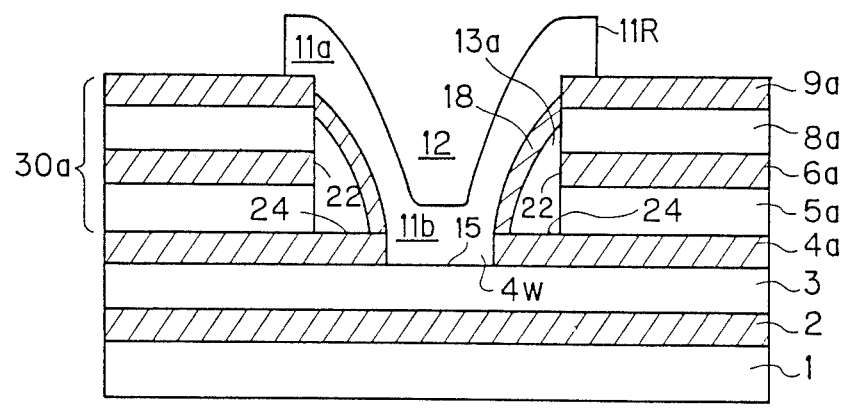

As a result, an interconnection structure shown in FIG. 3A and FIG. 3B is obtained, where FIG. 3A is a plane view of the structure and FIG. 3B is a cross section taken along the line X-Y in FIG. 3A. A conductive layer 11R remaining after the selective etching of the conductive layer 11 consists of a lateral part 11a connected to an internal circuit (not shown) provided in an arbitrary region on the substrate 1 which is provided out of FIG. 3A and FIG. 3B, and a connection part 11b existing in the contact hole 12 to interconnect the lateral part 11a and the conductive layer 3. The interconnection of the conductive layer 11R and the internal circuit is performed at a place out of the contact hole 12.

As understood from the above descriptions, the conductive layers 5a and 8a are interconnected through the connection wall 13a while the lateral part 11a and the conductive layer 3 are interconnected through the connection part 11b. In other words, the conductive layers 5a and 8a included in the multi-layer structure 30a are vertically interconnected by the connection wall 13a, while the upper conductive layer 11a existing on the multi-layer structure 30a and the lower conductive layer 3 existing under the multi-layer structure 30a are vertically interconnected by the connection film 11b through the contact hole 12 and the window 4w. These two interconnections are electrically insulated by the insulating film 18 included in the side wall 50. Although the lateral part 11a and the connection film 11b are formed as parts of a single conductive layer 11R, respectively, they may be formed individually.

According to the embodiment shown in FIG. 2 and FIG. 3, the interconnection structure interconnecting the upper and lower conductive layers 11a and 3 without reserving a dedicated area for the interconnection is obtained by a relatively simple processes. Further, a plurality of interconnections, one of which is for the interconnection of the upper and lower layers 11a and 3 and the other is for the interconnection of the conductive layers 5a and 8a, can be formed in a single contact hole 12. As a result, the number of contact holes to be provided in a semiconductor device is less than that of the conventional semiconductor device, thereby to improve the yield in the semiconductor device manufacturing. Since the area required for forming the contact holes can be decreased according to the present invention, the degree of integration of the semiconductor device is also improved.

Figure 4:
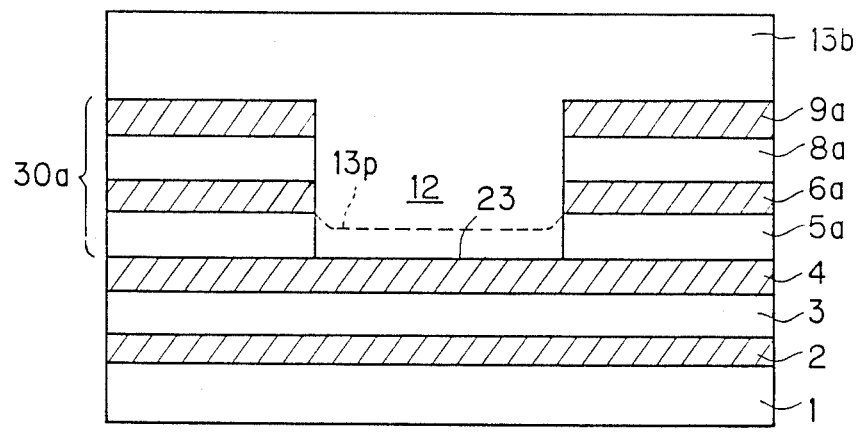
FIGS. 4, 5A, 5B and FIG. 6 are cross sections of semiconductor devices in manufacturing process steps for clear understanding of the embodiment.
Figure 5A:
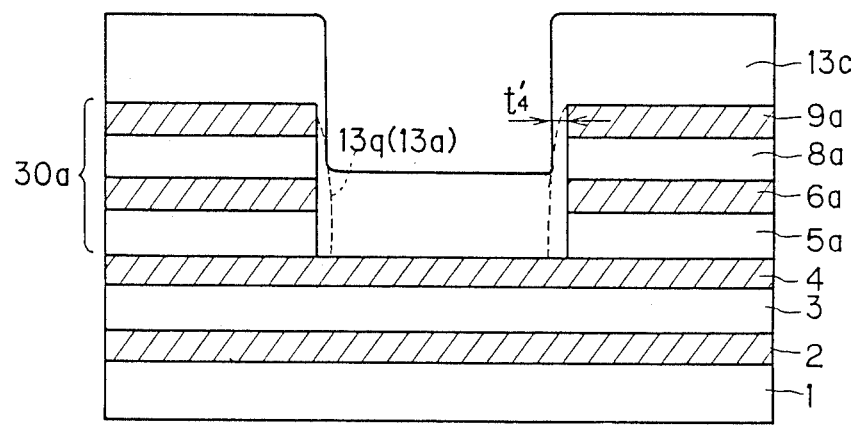
Figure 5B:
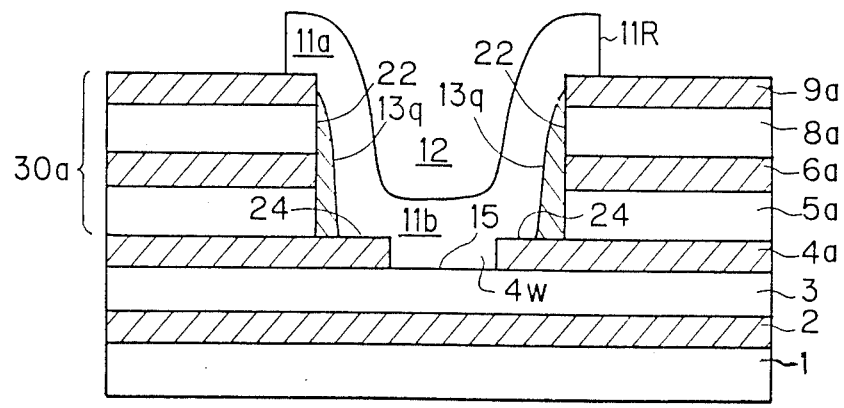
Figure 6:
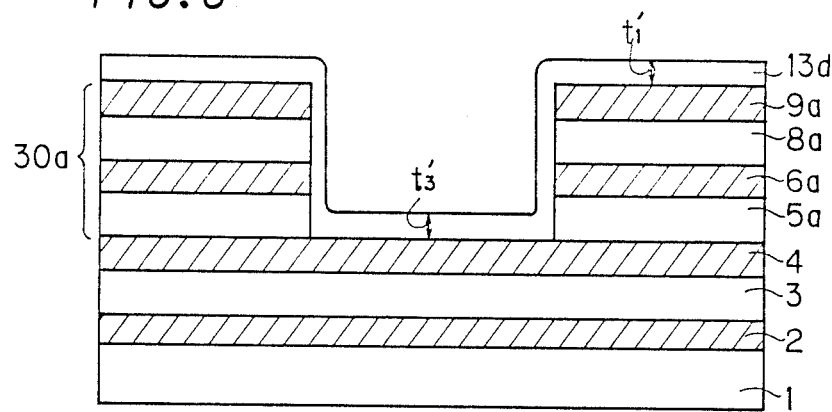

FIG. 4 to FIG. 6 are cross sections of interconnection structures for more clearly understanding of the preferred embodiment. When the structure of FIG. 4 in which a conductive layer 13b having a flat surface is formed in place of the structure of FIG. 2C, the connection wall 13a of FIG. 2D cannot be formed. Namely, an anisotropic plasma etching of the conductive layer 13b gives a conductive film 13p having a horizontal surface and existing on the bottom surface 23, rather than the connection wall 13a of FIG. 2D. Therefore, the structure of FIG. 4 is not suitable for manufacturing the semiconductor device of the present invention.

On the other hand, when a conductive layer 13c having a small thickness $t_4'$ on the insulating layer 9a is formed as shown in FIG. 5A, the width $W_2$ of the connection wall 13a (FIG. 2D) becomes small. In this case, the oxidation of the connection wall 13a provides an oxide film 13q extending to the whole region defined by the connection wall 13a, rather than only the surface region of the connection wall 13a. When the a part of conductive layer 4 is selectively removed by a etching process similary to FIG. 2F, and the upper conductive layer 11a and the connection film 11b are formed by the processes shown in FIG. 2G and FIG. 3, an interconnection structure of FIG. 5B is obtained. In the interconnection structure of FIG. 5B, the conductive layers 5a and 8a are not electrically connected, since the insulating film 13q contacting the side surface 22 of the multi-layer structure 30a directly is not conductive. The conductive layer 13C may be formed by a vacuum vapor deposition method, in which particles moving to the substrate 1 in the perpendicular direction to the major surface of the substrate 1 are relatively large in number. Another structure shown in FIG. 6 in which a conductive layer 13d having a relatively small thicknesses $t_1'$ and $t_3'$ is also suitable to obtain the structure of FIG. 5B. Namely, the structures of FIG. 5A and FIG. 6 in which the conductive layers 13c and 13d have the upper surface caving in the contact hole (recess) 12 can be employed in the present invention.

Figure 7A:
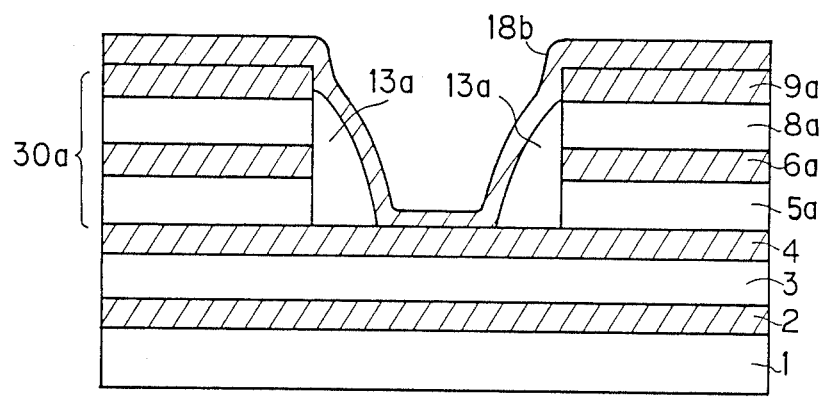
FIG. 7A and FIG. 7B are cross sections of a semiconductor device in manufacturing process steps according to another embodiment of the invention.
Figure 7B:
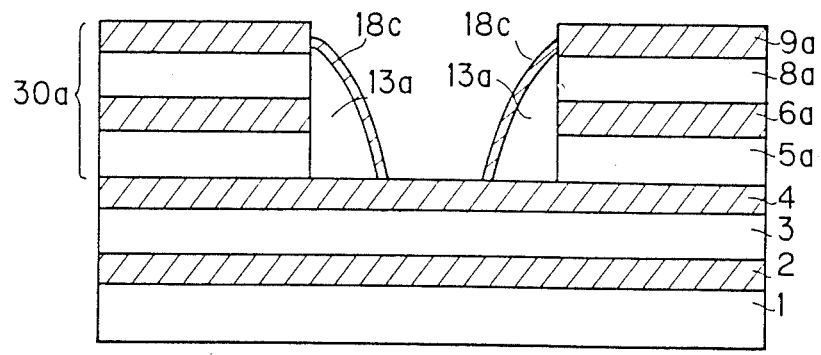

Another embodiment of the present invention is shown in FIG. 7A and FIG. 7B, as cross sections of a semiconductor device in manufacturing process steps. In FIG. 7A, an insulating layer 18b is deposited on the interconnection wall 13a and the conductive layer 9a by a CVD method, a sputtering method, a spinning application method or the like, in place of the oxidation process of the surface region of the connection wall 13a shown in FIG. 2E. The insulating layer 18b may be formed with silicon oxide, silicon nitride or the like. A part of the insulating layer 18b is selectively removed by the anisotropic plasma etching, to form an insulating film 18c (FIG. 7B) existing only on the connection wall 13a. The structure of FIG. 7B is substantially identical to that of FIG. 2E, and the structure of FIG. 3B is obtained through the processes shown in FIG. 2F to FIG. 2G.

Figure 8A:
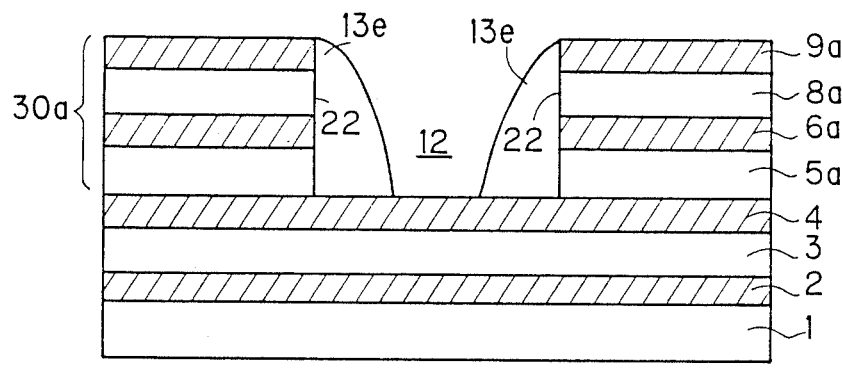
FIG. 8A and FIG. 8B are cross sections of a semiconductor device in manufacturing process steps according to further another embodiment of the present invention.
Figure 8B:
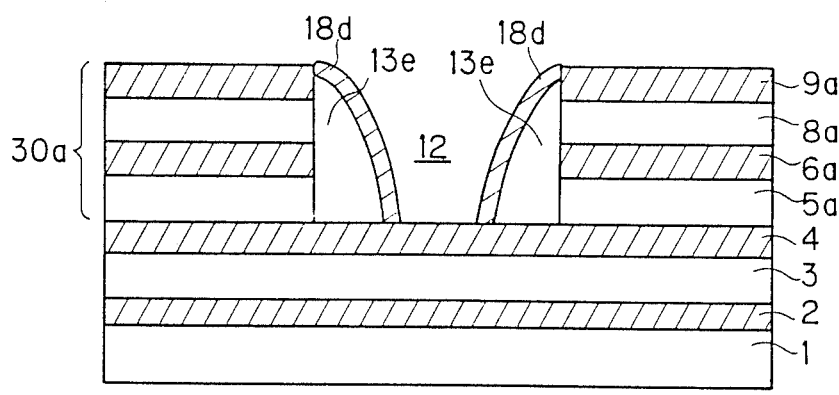

FIG. 8A and FIG. 8B show further another embodiment of the present invention, wherein a structure shown in FIG. 8A is given in place of that of FIG. 2D. As understood by comparing FIG. 8A and FIG. 2D, a connection wall 13e in FIG. 8A covers whole area of the side surface 22 of the multi-layer structure 30a, while the connection wall 13a of FIG. 2D does not cover the side surface of the insulating layer 9a. The connection wall 13e can be obtained by shorten the etching time of the conductive layer 13 of FIG. 2C. An insulating film 18d covering the surface of the connection wall 13e can be formed by oxiding the surface region of the connection wall 13e, thereby to obtain the structure of FIG. 8B which is corresponding to the structure of FIG. 2E.

Figure 9A:
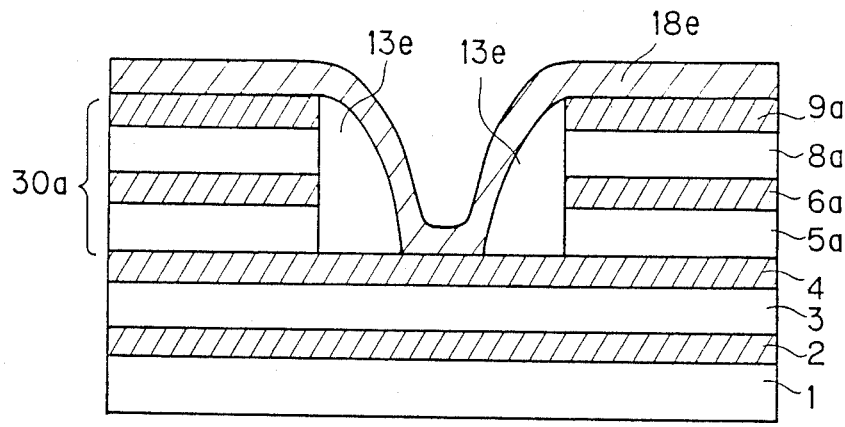
FIG. 9A and FIG. 9B are cross sections of a semiconductor device in manufacturing process steps according to still another embodiment of the present invention.
Figure 9B:
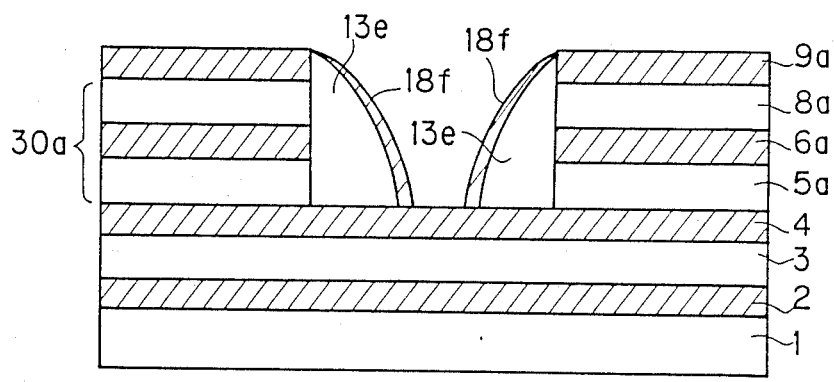

After obtaining the structure of FIG. 8A, an insulating layer 18e covering the upper surfaces of the connection wall 13e and the insulating layer may be deposited thereon, as shown in FIG. 9A. A part of the insulating layer 18e is removed by the anisotropic etching, to obtain an insulating film 18f covering the upper surface of the connection wall 13e. In this case, the thickness of the insulating film 18f at the side surface of the insulating layer 9a is relatively small, and therefore, the insulation performance of the insulating film 18f on the conecting wall 13e is relatively inferior to that of the insulating film 18 of FIG. 2E. Thus, when the connection wall 13e covering the whole area of the side surface 22 of the multi-layer structure 30a is formed, it is preferred that the insulation on the connection wall 13e is achieved by the insulating film 18d obtained by the oxidation of the surface region of the connection wall 13e, rather than by the insulating film 18f. The remaining process steps are similar to those shown in FIG. 2F and FIG. 2G.

The semiconductor device having the interconnection structure thus obtained may be a bipolar device, a unipolar device, a logical device, a memory device and the like.

Although the present invention has been described and illustrated in detail, it is clearly understood that same is by way of illustration and example only and is not to be taken by way of limitation, the spirit and scope of the present invention being limited only by the terms of the appended claims.

What is claimed is:

1. A semiconductor device comprising:
   (a) a substrate;
   (b) a first conductive layer provided on an upper surface of said substrate and connected to an internal circuit formed in an arbitrary region on said substrate;
   (c) a first insulating layer formed on an upper surface of said first conductive layer and having a window;
   (d) a multi-layer structure provided on an upper surface of said first insulating layer and having;
   (d-1) second conductive layers provided in parallel direction to said upper surface of said substrate and connected respectively to internal circuits formed in an arbitrary region on said substrate;
   (d-2) at least one second insulating layer inserted between said second conductive layers for insulating said second conductive layers from each other; and
   (d-3) a third insulating layer provided in a top of said multi-layer structure; where said multi-layer structure being provided with a contact hole communicating to said window, and a side surface of said contact hole is defined by a side surface of said multi-layer structure;
   (e) a third conductive layer provided on an upper surface of said multi-layer structure and connected to an internal circuit formed in an arbitrary region on said substrate;
   (f) a side wall provided in said contact hole to cover said side surface of said multi-layer structure while leaving said contact hole open and having a side conductive layer that interconnects at least two of said second conductive layers and an insulating film provided at least on a surface region of said side wall which faces to a center of said contact hole; and
   (g) a connection film provided in said contact hole contacting said first conductive layer through said window and connected to said third conductive layer on said contact hole thereby to electrically interconnect said first and third conductive layers, said connection film being electrically insulated from said second conductive layers by said side wall.

2. A semiconductor device in accordance with claim 1, wherein
   a width of said contact hole is greater than a width of said window, whereby a part of said first insulating layer surrounding said window is not provided with said multi-layer structure thereon, and said side wall contacts a surface of said part of said first insulating layer, whereby said part of said first insulating layer functions as a spacer region between said side wall and said first conductive layer.

3. A semiconductor device in accordance with claim 2, wherein
said side wall further comprises a conductive wall on which said insulating film is provided, and
said second layers are electrically interconnected in a vertical direction through said conductive wall.

4. A semiconductor device in accordance with claim 3, wherein
said side wall has a vertical cross section of substantial triangle form having an arc oblique side which defines a surface of said side wall facing said center of said contact hole and a bottom side existing on said part of said first insulating layer.

5. A semiconductor device in accordance with claim 4, wherein
said substrate is a semiconductor substrate, and
said first conductive layer is provided on an upper surface of a fourth insulating layer formed on said upper surface of said substrate.

6. A semiconductor device in accordance with claim 5, wherein
said third conductive layer and said connection film are parts of a single conductive layer, respectively.

7. A semiconductor device comprising:
(a) a first conductive layer,
(b) a first insulating layer formed on an upper surface of said first conductive layer and having a first window,
(c) a second conductive layer formed on an upper surface of said first insulating layer and having a second window located at said first window of said first insulating layer,
(d) a second insulating layer formed on an upper surface of said second conductive layer and having a third window located at said second window of said second conductive layer, the width of said third window being the same as that of said second window,
(e) a third conductive layer formed on an upper surface of said second insulating layer and having a fourth window located at said third window of said second insulating layer, the width of said fourth window being the same as that of said third window,
(f) a third insulating layer formed on an upper surface of said third conductive layer and having a fifth window located at said fourth window,
(g) a side conductive layer formed on the side end of said second conductive layer exposed at said second window, the side end of said second insulating layer exposed at said third window, and the side end of said third conductive layer exposed at the fourth window, and electrically interconnecting said second and third conductive layer,
(h) a side insulating layer formed on a surface of said side conductive layer, and
(i) a fourth conductive layer formed on an upper surface of said third insulating layer, a surface of said side insulating layer, and the exposed surface of said first conductive layer located at said first window of said first insulating layer, and electrically connected to said first conductive layer.

8. A semiconductor device in accordance with claim 11, wherein
the width of said first window is smaller than that of said second window, and
the bottom surface of said side conductive layer touches the upper surface of said first insulating layer within said second window.

* * * * *